(12) United States Patent
Peng et al.

(10) Patent No.: US 8,657,242 B2
(45) Date of Patent: Feb. 25, 2014

(54) FIXING DEVICE FOR CIRCUIT BOARD

(75) Inventors: Wen-Tang Peng, Tu-Cheng (TW);
Chieh-Hsiang Lin, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 219 days.

(21) Appl. No.: 13/115,121

(22) Filed: May 25, 2011

(65) Prior Publication Data

US 2012/0168578 A1    Jul. 5, 2012

(30) Foreign Application Priority Data

Dec. 29, 2010 (TW) .............................. 99146734 A

(51) Int. Cl.
*F16M 11/20* (2006.01)
*H05K 7/02* (2006.01)
*H05K 7/04* (2006.01)

(52) U.S. Cl.
USPC ........ 248/188.1; 361/759; 361/807; 361/810; 174/138 E

(58) Field of Classification Search
CPC ............................ H01L 23/4093; H05K 7/142
USPC .............. 248/188.1; 411/80.1, 117, 429, 918, 411/925; 361/760, 748, 759, 810, 758, 807, 361/809; 257/E23.086; 174/138 E, 138 G, 174/138 D See application file for complete search history.

(56) References Cited

U.S. PATENT DOCUMENTS

| | | | | |
|---|---|---|---|---|
| 5,519,169 A | * | 5/1996 | Garrett et al. .................. | 174/371 |
| 6,809,929 B2 | * | 10/2004 | Liu ................................ | 361/704 |
| 7,028,389 B2 | * | 4/2006 | Chang ............................ | 29/739 |
| 7,110,264 B2 | * | 9/2006 | Chen et al. .................... | 361/801 |
| 2012/0170229 A1 | * | 7/2012 | Lin et al. ........................ | 361/748 |

* cited by examiner

*Primary Examiner* — Anita M King
(74) *Attorney, Agent, or Firm* — Altis Law Group, Inc.

(57) ABSTRACT

A fixing device for circuit boards with different thickness includes a base board, a number of posts protruding from the base board, a number of resilient brackets for mounting to the posts, and a number of fasteners inserted through one of the circuit boards and the resilient brackets to engage with the protruding posts, thereby urging the deformation of the resilient brackets according to the thickness of the particular circuit board.

6 Claims, 4 Drawing Sheets

FIXING DEVICE FOR CIRCUIT BOARD

BACKGROUND

1. Technical Field

The present disclosure relates to an adjustable device for fixing a circuit board.

2. Description of Related Art

A circuit board ordinarily is fixed to a computer chassis through a plurality of supporting posts. When there is a need to fix another circuit board having a different thickness or other different quality, the supporting posts must be replaced with others. However, in most cases, the supporting posts are integrally formed with the chassis, which makes replacement difficult or even impossible.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
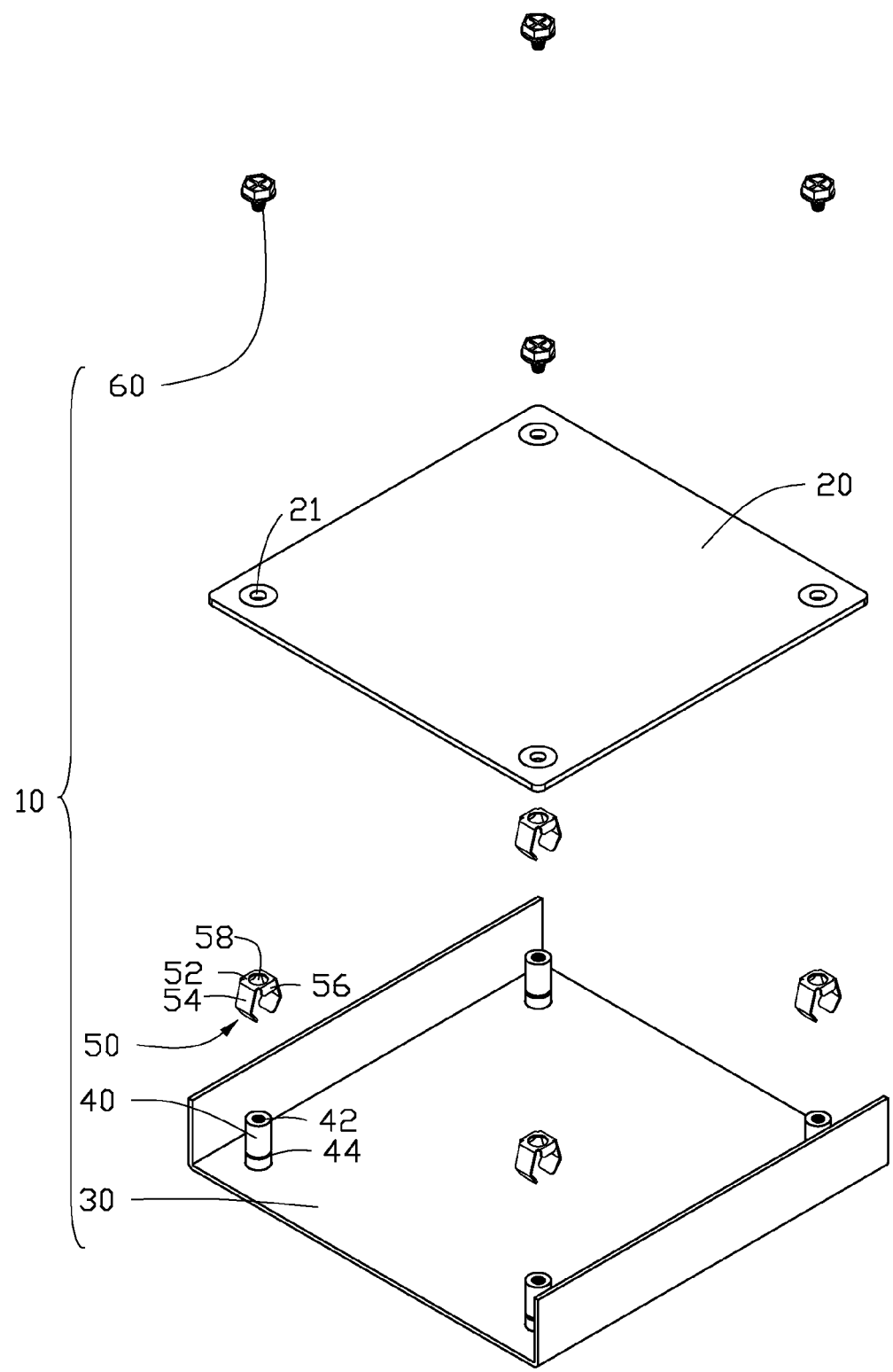
FIG. 1 is an exploded, isometric view of an exemplary embodiment of a fixing device, together with a circuit board.

Referring to FIG. 1, an exemplary embodiment of a fixing device 10 used for fixing different circuit boards includes a base board 30, a plurality of posts 40 protruding from the base board 30, a plurality of resilient bracket 50, and a plurality of fasteners 60. In this embodiment, the fasteners 60 are screws.

In one embodiment, the base board 30 is a sidewall of a computer enclosure, or a board fixed to a sidewall within the computer enclosure. Each post 40 axially defines a threaded hole 42 inside the post 40, and a slot 44 around the circumference of the post 40 in close proximity to the base board 30.

Each resilient bracket 50 includes a plate 52, two substantially V-shaped elastic arms 54 extending down from two opposite ends of the plate 52, and two flanges (blocking portions 56) extending down from another two opposite sides of the plate 52. A through hole 58 is defined in the plate 52.

Figure 2:
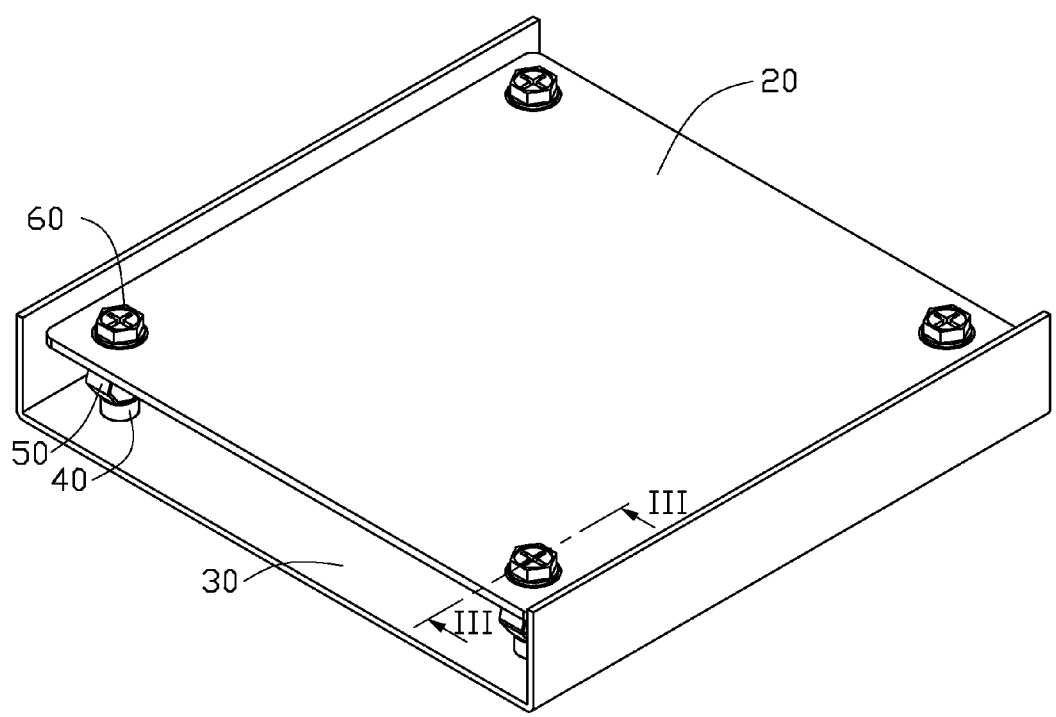
FIG. 2 is an assembled, isometric view of FIG. 1.
Figure 3:
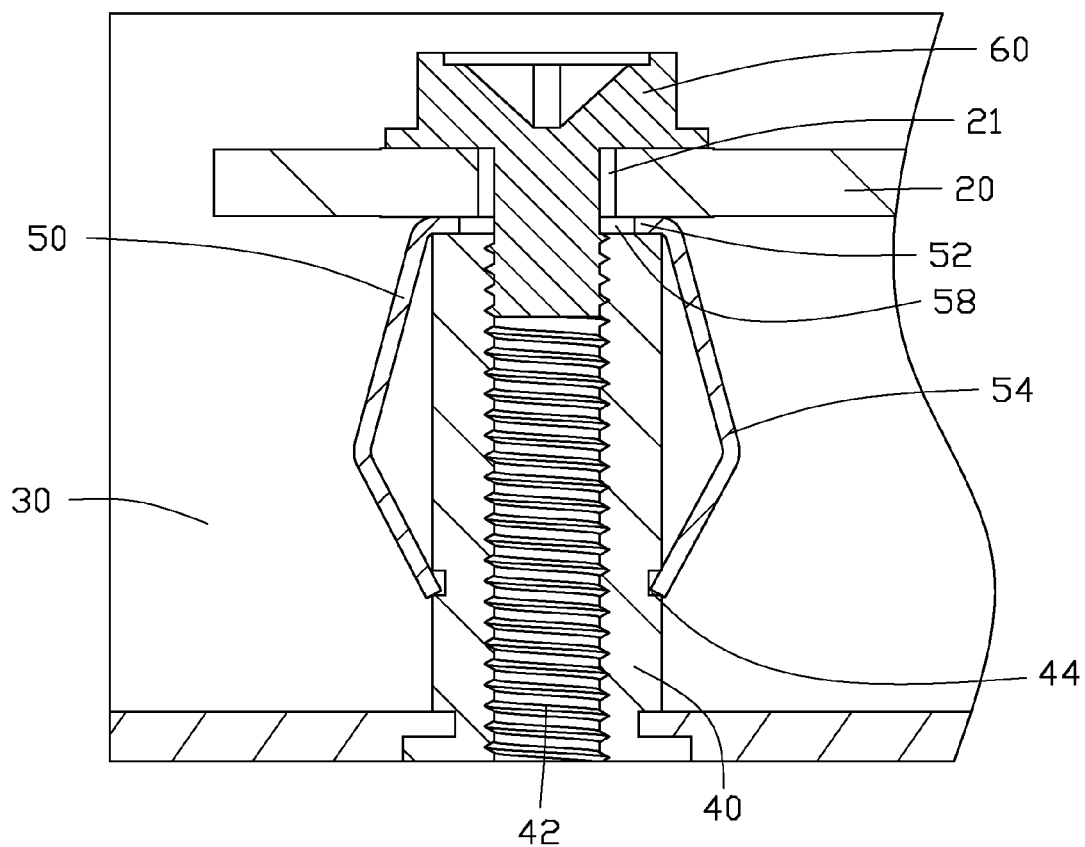
FIG. 3 is a sectional view of FIG. 2, taken along the line III-III.

Referring to FIGS. 2 and 3, in assembly, each resilient bracket 50 is mounted to a post 40. The post 40 extends through a receiving space bounded by the arms 54 and between the blocking portions 56, until the distal ends of the arms 50 engage in the slot 44. At this time, the top of the post 40 is not in contact with the underside of the plate 52. The plate 52 locates above the top of the post 40, and the through hole 58 is in an alignment with the threaded hole 42.

To fix a first circuit board 20 defining a plurality of fixing holes 21, the circuit board 20 is supported on the plates 52, with the fixing holes 21 in alignment with the corresponding through holes 58. The fasteners 60 extend through the fixing holes 21 and the corresponding through holes 58, and are screwed into the threaded holes 42 of the posts 40, possibly (depending on the exact thickness of the circuit board), deforming the arms 54, and thereby securing the circuit board 20 to the posts 40. At this time, the underside of the plates 52 is in contact with the top of the posts 40; the blocking portions 56 of each resilient bracket 50 sandwich the external circumference of the corresponding posts 40.

Figure 4:
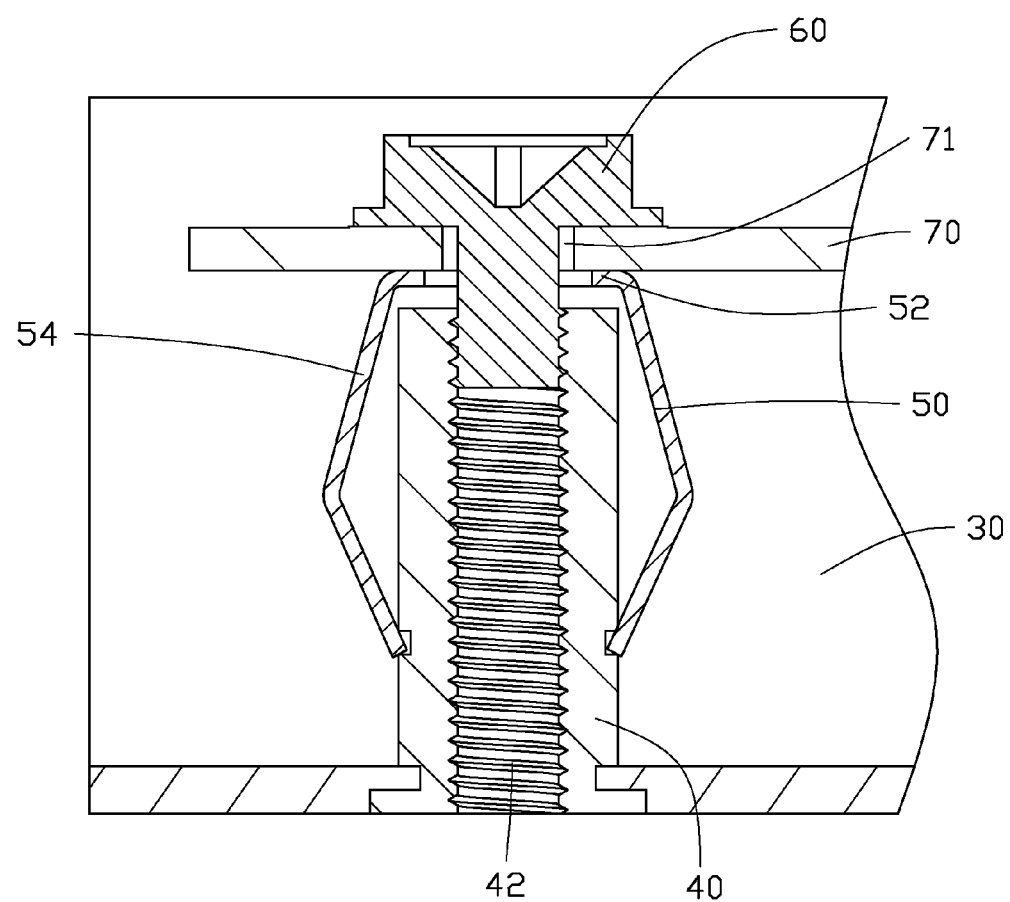
FIG. 4 is a sectional view of the fixing device of FIG. 1 for fixing another circuit board.

Referring to FIG. 4, to fix a second circuit board 70 which defines a plurality of through holes 71 and having a thickness less than the circuit board 20, a distance can be maintained between the underside of the plates 52 and the tops of the corresponding posts 40 by the elastic force of the arms 54. The circuit board 70 will be supported on the plates 52. Each fastener 60 will extend through a through hole 71, and the through hole 58 of a resilient bracket 50, and be screwed into a corresponding threaded hole 42, with deformation the resilient brackets 50 to suit exactly the thickness of the circuit board 70.

In other embodiments, the resilient brackets 50 may be fixed to the posts 40, with the plates 52 moveable relative to the tops of the posts 40 and the arms 54 moving closer to or farther away from the posts 40, in supporting a circuit board.

It is believed that the present embodiments and their advantages will be understood from the foregoing description, and they will be apparent that various changes may be made thereto without departing from the spirit and scope of the description or sacrificing all of their material advantages, the examples hereinbefore described merely being exemplary embodiments.

What is claimed is:

1. A fixing device for circuit boards with different thicknesses, the fixing device comprising:
   a base board;
   a plurality of posts protruding from the base board;
   a plurality of resilient brackets to be respectively mounted to the posts; and
   a plurality of fasteners to extend through a circuit board and the resilient brackets to engage in the posts, and deform the resilient brackets according to the thickness of the circuit board;
   wherein each resilient bracket comprises a plate to be located above a corresponding one of the posts, and two elastic arms extending down from opposite ends of the plate; distal ends of the elastic arms are fixed on a corresponding one of the posts;
   wherein the elastic arms of each resilient bracket are substantially V-shaped and oppose to each other; and
   wherein each post defines a slot in a circumference for engaging with distal ends of the elastic arms of a corresponding one of the resilient brackets.

2. The fixing device of claim 1, wherein a through hole is defined in the plate for a corresponding one of the fasteners to pass through.

3. The fixing device of claim 1, wherein two blocking portions extend down from opposite sides of the plate to sandwich a corresponding one of the posts.

4. The fixing device of claim 1, wherein each post axially defines a threaded hole in a top, the fasteners are screws to screw in the threaded holes of the corresponding posts.

5. A fixing device for circuit boards with different thicknesses, the fixing device comprising:
   a base board;
   a plurality of posts protruding from the base board;
   a plurality of resilient brackets to be respectively mounted to the posts; and a plurality of fasteners to extend through a circuit board and the resilient brackets to engage in the posts, and deform the resilient brackets according to the thickness of the circuit board;

wherein each resilient bracket comprises a plate to be located above a corresponding one of the posts, and two elastic arms extending down from opposite ends of the plate; and wherein each post defines a slot in a circumference for engaging with distal ends of the arms of a corresponding one of the resilient brackets.

6. A fixing device for circuit boards with different thicknesses, the fixing device comprising:

a base board;

a plurality of posts protruding from the base board;

a plurality of resilient brackets to be respectively mounted to the posts; and a plurality of fasteners to extend through a circuit board and the resilient brackets to engage in the posts, and deform the resilient brackets according to the thickness of the circuit board;

wherein each resilient bracket comprises a plate to be located above a corresponding one of the posts, and two elastic arms extending down from opposite ends of the plate; and wherein two blocking portions extend down from opposite sides of the plate.

* * * * *